(12) United States Patent
Melamed-Kohen et al.

(10) Patent No.: US 8,074,195 B2
(45) Date of Patent: Dec. 6, 2011

(54) SYSTEM AND METHOD FOR EVALUATING A DYNAMIC POWER CONSUMPTION OF A BLOCK

(75) Inventors: Eyal Melamed-Kohen, Modiin (IL); Assaf Babay, Modiin (IL); Rony Bitton, Petah Tikva (IL); Ilan Cohen, Elad (IL)

(73) Assignee: Freescale Semiconductor, Inc., Austin, TX (US)

( * ) Notice: Subject to any disclaimer, the term of this patent is extended or adjusted under 35 U.S.C. 154(b) by 651 days.

(21) Appl. No.: 12/163,633

(22) Filed: Jun. 27, 2008

(65) Prior Publication Data

US 2009/0327980 A1    Dec. 31, 2009

(51) Int. Cl.
*G06F 9/45* (2006.01)
*G06F 17/50* (2006.01)
*G06F 9/455* (2006.01)

(52) U.S. Cl. .................................. 716/109; 716/133
(58) Field of Classification Search .................. 716/109, 716/133
See application file for complete search history.

(56) References Cited

U.S. PATENT DOCUMENTS

| | | | |
|---|---|---|---|
| 5,966,523 A | 10/1999 | Uchino | |
| 6,075,932 A * | 6/2000 | Khouja et al. | 716/109 |
| 6,611,945 B1 * | 8/2003 | Narasimhan et al. | 716/103 |
| 6,675,305 B1 | 1/2004 | Mohammad | |
| 7,131,078 B1 * | 10/2006 | Maheshwari et al. | 716/104 |
| 7,143,368 B1 | 11/2006 | Plofsky et al. | |
| 7,774,186 B2 | 8/2010 | Ho | |
| 2008/0195985 A1 * | 8/2008 | Kanazawa | 716/4 |
| 2009/0271167 A1 * | 10/2009 | Zhu et al. | 703/14 |

OTHER PUBLICATIONS

Fraer et al.; "A New Paradigm for Synthesis and Propagation of Clock Gating Conditions"; Jun. 8, 2003; Intel Corporation; pp. 658-663.*
Sait, Sadiq M. et al.; "Fuzzy Simulated Evolution for Power and Performance Optimization of VLSI Placement"; Proceeding of 2001 International Joint Conference on Neural Networks; 2001; pp. 738-743; vol. 1, Issue 2001; IEEE.
Jin, Hoon-Sang et al.; "Dynamic Power Estimation Using the Probabilistic Contribution Measure (PCM)"; Proceedings of the 1999 International Symposium on Low Power Electronics and Design; 1999; pp. 279-281; IEEE.
Wang, Chuan-Yu et al.; "Estimation of Maximum Power for Sequential Circuits Considering Spurious Transitions"; ICDD 97 Proceedings; Oct. 12-15, 1997; pp. 746-751; IEEE.
Tsui, Chi-Ying et al.; "Efficient Estimation of Dynamic Power Consumption under a Real Delay Model"; Proceedings of 11th AC/IEEE ICCAD; 1993; pp. 224-228, IEEE.
Najm; Farid et al.: Transition Density: A New Measure of Activity in Digital Circuits; IEEE Transactions on Computer-Aided Design of Integrated Circuits and Systems; Feb. 1993; pp. 310-323; vol. 12, No. 2; IEEE.
Najm, Farid N et al..; Probabilistic Simulation for Reliability Analysis of CMOS VLSI Circuits; IEEE Transactions on Computer Aided Design; Apr. 1990; pp. 439-450; vol. 9, No. 4; IEEE.
Ding, Chih-Shun et al.; Tagged Probabilistic Simulation Provides Accurate and Efficient Power Estimates at Gate Level:; 1995; pp. 42-43; IEEE.
Degalahal, V. et al., "Methodology for High Level Estimation of FPGA Power Consumption," IEEE Design Automation Conference, Jan. 18-21, 2005, vol. 1, pp. 657-660.

* cited by examiner

*Primary Examiner* — Suresh Memula

(57) ABSTRACT

A method for evaluating a dynamic power consumption of a block, the method includes: receiving or generating information representative of the block during a preliminary block design stage that precedes a gate level simulation of the block; estimating change probabilities of signals of internal components of the block; and evaluating a dynamic power consumption of the block in response to the change probabilities of the signals of internal components of the block.

16 Claims, 3 Drawing Sheets

SYSTEM AND METHOD FOR EVALUATING A DYNAMIC POWER CONSUMPTION OF A BLOCK

FIELD OF THE INVENTION

The present invention relates to a system and a method for evaluating a dynamic power consumption of a block.

BACKGROUND OF THE INVENTION

Integrated circuits are designed by a highly complex design process. Typically, each stage of the design process provides more information about the designed integrated circuit, but is more costly and typically more complex. In addition, problems that are detected during later stages of the design process are typically harder to resolve, especially if their amendment requires performing earlier design process stages.

An integrate circuit includes multiple blocks and each block includes multiple internal components, input ports and output ports. An internal component can include a logic gate, (also referred to as a combinatory cell), a flip-flop, a transistor, or even a function. A block can be a core, a logic circuit, a memory unit, and the like. A block is typically re-used in different integrated circuits.

A typical design process of an integrated circuit block includes various stages. The design process can include receiving a register transfer level description and synthesizing the register transfer level description. This description can be transformed to a gate level design by synthesis. It is noted that the synthesis process can include a so-called placed and route stage that provides the layout of the block. This stage is followed by verifying the block design. Various vendors such as Cadence and Synopsis provide various tools such as that streamline the design process. Verilog and VHDL are known hardware description languages for describing blocks during the design process.

A known prior art tool for power estimation (such as Power Meter or Primepower) provides a power estimate after a gate level design of the block is generated. The power estimate is very accurate but is executed at a relatively late stage of the design process and requires a gate level run on a test pattern, which consumes time and machine time. Altering the design of the block at such a late stage of the design process is very costly and time consuming.

SUMMARY OF THE PRESENT INVENTION

The present invention provides a method and a device as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects, and embodiments of the invention will be described, by way of example only, with reference to the drawings.

DETAILED DESCRIPTION OF PREFERRED EMBODIMENTS

Figure 1:
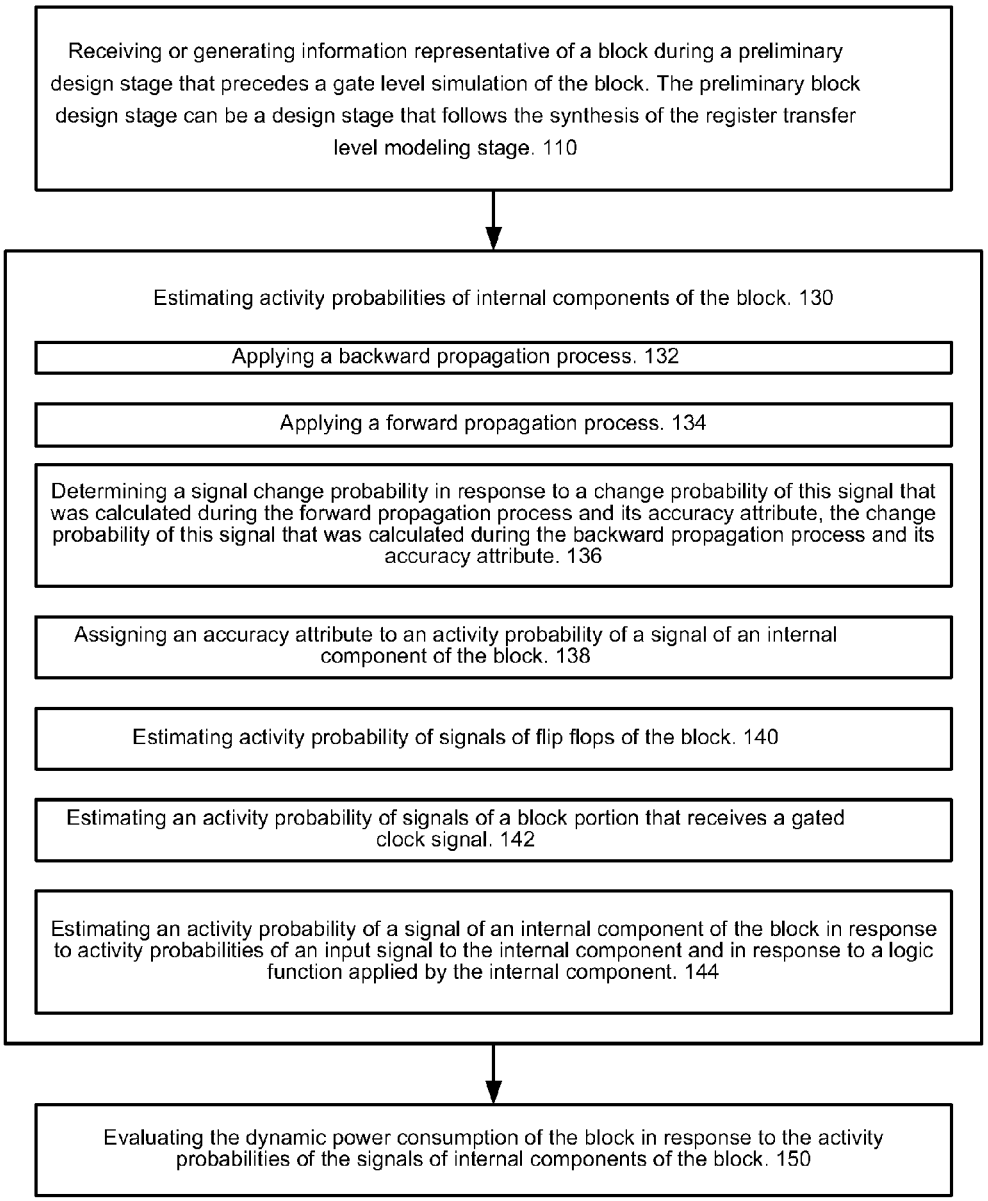
FIG. 1 schematically shows an example of embodiment of a method for estimating a dynamic power consumption of a block.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the following specification, the invention will be described with reference to specific examples of embodiments of the invention. It will, however, be evident that various modifications and changes may be made therein without departing from the broader spirit and scope of the invention as set forth in the appended claims.

It was shown that a dynamic power estimation of a block could be estimated during a preliminary stage of the design process. Using information about input ports and output ports of a block, and information of some internal pins, the dynamic power estimation of the block change probabilities of signals of a block can be estimated. This estimation can provide an indication about the dynamic consumption of the block, as signals changes cause various capacitances of the block to be charged or be discharged. A change probability of a signal indicates a chance that the value of the signal will change. The change probability of a signal can provide a indication of the expected amount of changes of this signal in a period of time. Various signals can be received by internal components of the block and can be outputted by internal components of the block.

The power estimation process can include applying forward propagation process, and additionally or alternatively, a backward propagation process.

A backward propagation process estimates a change probability of an input signal to an internal component in response to a change probability of an output signal of the internal component, while a forward propagation process estimates a change probability of an output signal of an internal component in response to a change probability of an input signal to the internal component. A backward propagation process can start by receiving change probabilities of signals that are outputted from output ports of a block and, additionally or alternatively, by receiving the expected values of signals from these output ports.

A forward propagation process can start by receiving (or generating) change probabilities of signals inputted to input ports of a block and, additionally or alternatively, by receiving the expected values of signals that are provided to these input ports.

Each of these mentioned above propagation processes can involve attaching an accuracy attribute to a change probability of a signal that is either inputted to an internal component or outputted by the internal component. The accuracy attribute can be correlated to the length of the path between an internal component to an input port or an output port of the block. For example, longer paths (paths that include more internal components) can be associated with lower accuracy.

If, for example, a change probability of a signal of an internal component is responsive to many estimated change probabilities of signals from other internal components its accuracy attribute can be regarded as lower. The type of internal components included in the path (logic gates, flipflops) as well as their connectivity (feedback loop, sequential connectivity without feedback loops, parallel connectivity) can also affect the accuracy attribute.

Additionally, by executing multiple iteration of the power estimation process, the accuracy of the signal change probability increases. The number of iterations can be set in advance. Alternatively, the iterations can continue until the iterative process converges and the difference between the results of consecutive iterations are smaller than a predefined threshold.

When the power estimation is executed during later (yet preliminary) stages of the design process the accuracy attributes are higher as there is more knowledge on the block. This knowledge can include, for example, detailed description of various signals provided to the block, various signals outputted from the block, and the like.

The knowledge can include the values of Flip-Flops and outputs and Flip-Flop inputs. This knowledge can be generated by running a pattern simulation on the register transfer level representation of the block, especially when the names of the signals that are input signals or output signals of Flipflops can be the same in register transfer level as in the gate level.

The accuracy attribute can be used to select between change probabilities obtained during a backward propagation process and change probabilities obtained during a forward propagation process.

The accuracy attribute of each change probability can be used to determine a change probability that is responsive to both change probabilities. For example—the change probability can have a value that is closer to the more accurate change probability.

The accuracy attribute can also be used when only a single process out of the backward propagation process and the forward propagation process is executed. The accuracy attribute can assist in determining change probabilities in cases where multiple input signals are provided to the same internal component and there is a need to decide the values of some of these input signals.

FIG. 1 is a flow chart of method 100 according to an embodiment of the invention.

Method 100 starts by stage 110 of receiving or generating information representative of a block during a preliminary design stage that precedes a gate level simulation of the block. The preliminary block design stage can follow a synthesis of a register transfer level modeling stage of the block.

The type of information can differ in response to the preliminary design stage. The information can include the functionality of the block, initial (default) values of various input signals that are provided to the block, change probabilities of output and input signals provided by output and input ports of the blocks, the connectivity of internal components such as flip-flops, logic gates and the like.

The change probabilities of signals provided to the block can be estimated from previous design attempts of similar blocks, from the expected functionality of the block, from the type of signals (for example—the change probability of a non-gated clock signal is one ("high") while the change probability of a reset signal can be regarded as very low as is changes only once during very long periods).

The designer of the block, a member of the modeling team or even an architecture designer can provide some change probabilities but this is not necessarily so.

Change probabilities can be influenced by initial values of these input signals and/or output signals.

Stage 110 is followed by stage 130 of estimating change probabilities of signal provided by internal components of the block or received by the internal components of the block.

Stage 130 can include at least one of the following stages: (i) stage 132 of applying a backward propagation process; (ii) stage 134 of applying a forward propagation process; (iii) stage 136 of determining a signal change probability in response to a change probabilities of this signal that was calculated during the forward propagation process, its accuracy attribute, the signal change probabilities calculated during the backward propagation process and its accuracy attribute; (iv) stage 138 of assigning an accuracy attribute to an change probability of a signal of an internal component of the block; (v) stage 140 of estimating change probabilities of signals of flip flops of the block; and (vi) stage 142 of estimating an change probability of signals of a block portion that receives a gated clock signal; (vii) stage 144 of estimating a change probability of a signal of an internal component of the block in response to change probabilities of an input signal to the internal component and in response to a logic function applied by the internal component.

Stage 136 can include selecting one of these change probability, performing a weighted average, and the like.

It is noted that stage 130 can be executed multiple times, wherein each execution iteration provides more information.

The estimation of the change probabilities of signals can be made based on one (or both) of the following assumptions: (i) it is not likely that different input signals of the same internal component will toggle simultaneously such as to cancel the toggling of an output signal, and (ii) a signal has (in average, especially when a large number of internal components form the block) the same probability of being at a high level and at a low level. This is mostly true but in various edge cases (for example reset) these assumptions are not necessarily accurate.

These mentioned above assumption can lead to a conclusion that the change probability of an output signal of an internal element is substantially equal to predetermined function (such as but not limited to an averaging function) of the change probabilities of the input signals to this internal element. This is represented by stage 144.

The second assumption can be useful when assigning default values to various signals (including input signals and output signals of the whole block).

It is noted that the calculation of an activity of a logic cell at a time (rather than calculating activity probabilities of a whole logic cone or a whole logic network) greatly simplifies the estimation process but that the estimation also takes into account the logic function of the internal component.

As a general rule the duty cycles of signals are not calculated or estimated. Nevertheless, there are some cases that can require a better estimation of the duty cycle. In this case, more computing resource can be required and a synthesis process can be executed to determine the duty cycle.

A typical case that requires duty cycle calculations can relate to a local gating of a clock signal by a control signal. A local clock gating differs from the well known region based clock gating in which a whole region is shut down by gating the clock signal. The local clock gating can occur if during the design process a logical function is implemented by gating a clock signal. This gated clock signal is usually provided to one or few internal components. When a local clock gating occurs, the estimation process will estimate the duty cycle of the control signal that gates the clock signal. The clock cycles can then be simulated by the synthesis process.

Conveniently, during the estimation process sequential internal components such as flip-flops are given initial input and/or output values. These values can be used during a first estimation process that involves estimating change probabilities based upon these initial values as well as other information. The first iteration can be followed by executing multiple iterations during which the change probabilities and the values of sequential cells are re-calculated.

Stage 130 can also include assuming an initial value of internal components that are connected to each other, wherein this initial value (in contrary to other initial values) can cause the internal components to change their value a single (or a few number of) times. For example—an output of a flip flop can toggle once (in response to a change in the input signal from one to zero) if the flip flop is connected to an AND gate in the following manner—an input of a AND gate can receive an input signal. The other input of the AND gate is connected to an output of a flip-flop. The input of the flip-flop is connected to the output of the AND gate.

Stage 130 is followed by stage 150 of evaluating the dynamic power consumption of the block in response to the change probabilities of the signals of internal components of the block.

The dynamic power consumption resulting from a signal can be responsive to the change probability of that signal and to a capacitance that is driven (charged or discharged) by this signal. The capacitances can be estimated or evaluated in various manners, including using typical capacitances of a manufacturing process that will be used to manufacture the block, capacitances of previously designed blocks, and the like.

It is noted that method 100 can also include adding an estimated static power consumption of the block (that is estimated by methods other than method 100) to the estimated dynamic power consumption of the block to provide an estimation of the overall power consumption of the block. Prior art methods and tools can be used for providing the estimated static power consumption of the block.

It is further noted that the estimated dynamic power consumption of the block can trigger a re-design effort of the block or of a portion of the block. This re-design can include re-executing preliminary design stages.

Figure 2:
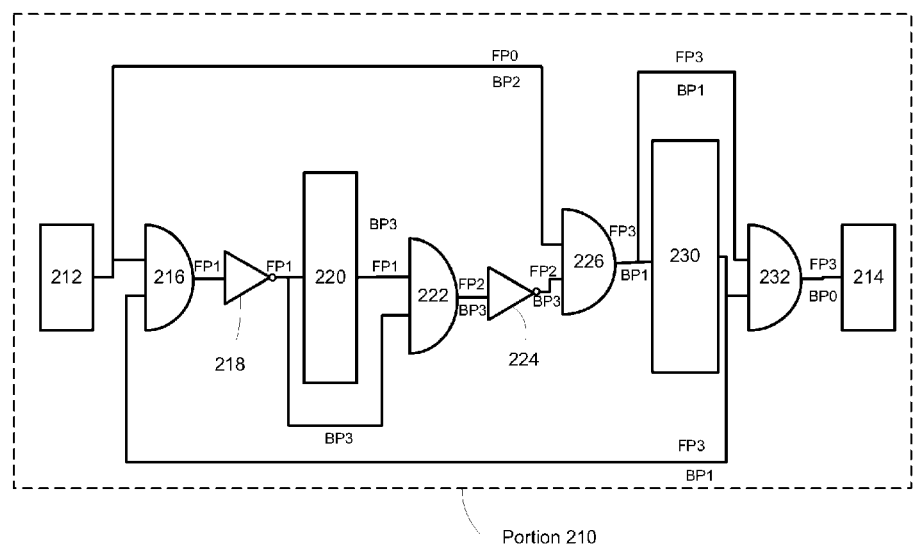
FIG. 2 schematically shows an example of embodiment of a block and change probabilities.

The estimated dynamic power consumption of the block can be used for different optimization to reduce power—for example—a high toggling wire can be put with high weight to the router such that it will not detour. There are more tradeoff which can be considered (like deciding not lowering a cell VT cause it is high toggle net FIG. 2 illustrates portion 210 of block 200 and various change probabilities of various signals according to an embodiment of the invention.

Portion 210 includes an input port 212 that receives an input signal of a known change probability FP0. Portion 210 also includes output port 214 that outputs an output signal of a known change probability BP0. An input of first AND gate 216 is connected to input port 212, an output of first AND gate 216 is connected to an input of first inverter 218 while the output of first inverter 218 is connected to an input of first flip-flop 220 and to an input of second AND gate 222. An output of first flip-flop 220 is connected to another input of second AND gate 222. An output of second AND gate 222 is connected to an input of second inverter 224. An output of second inverter 224 is connected to an input of third AND gate 226. Another input of third AND gate 226 is connected to input port 212.

An output of third AND gate 226 is connected to an input of fourth AND gate 232 and to an input of second flip-flip 230. An output of second flip-flop 230 is connected to another input of first AND gate 216 and to another input of fourth AND gate 232. The output of fourth AND gate 232 is connected to output port 214.

A backward propagation process estimates the change probabilities of various signals of these internal components (216, 218, 220, 222, 224, 226, 228 and 230) starting from the change probability BP0 of the output signal of output port 214 and going backwards—till reaching input port 212. When applying a backward propagation process the accuracy of change probability are inversely proportional to a length of the path between each signal and output port 214.

A forward propagation process estimates the change probabilities of various signals of these internal components (216, 218, 220, 222, 224, 226, 228 and 230) starting from the change probability FP0 of the input signal of input port 212 and going forwards—till reaching output port 214. When applying a forward propagation process the accuracy of change probabilities are inversely proportional to a length of the path between each signal and input port 212.

If both propagation processes are applied then a determination process can be applied. The determination process can take into account both change probabilities of a signal (calculated by applying the two propagation processes) and their accuracy attributes. The determination process can involve, for example, a selection between these two change probabilities, a weighted average of these probabilities (wherein the weight is the accuracy attribute) or applying any function that is responsive to these parameters.

It is further noted that the estimation process can also be responsive to signals of flip-flops that in various stages of the design process are known or can be estimated.

Figure 3:
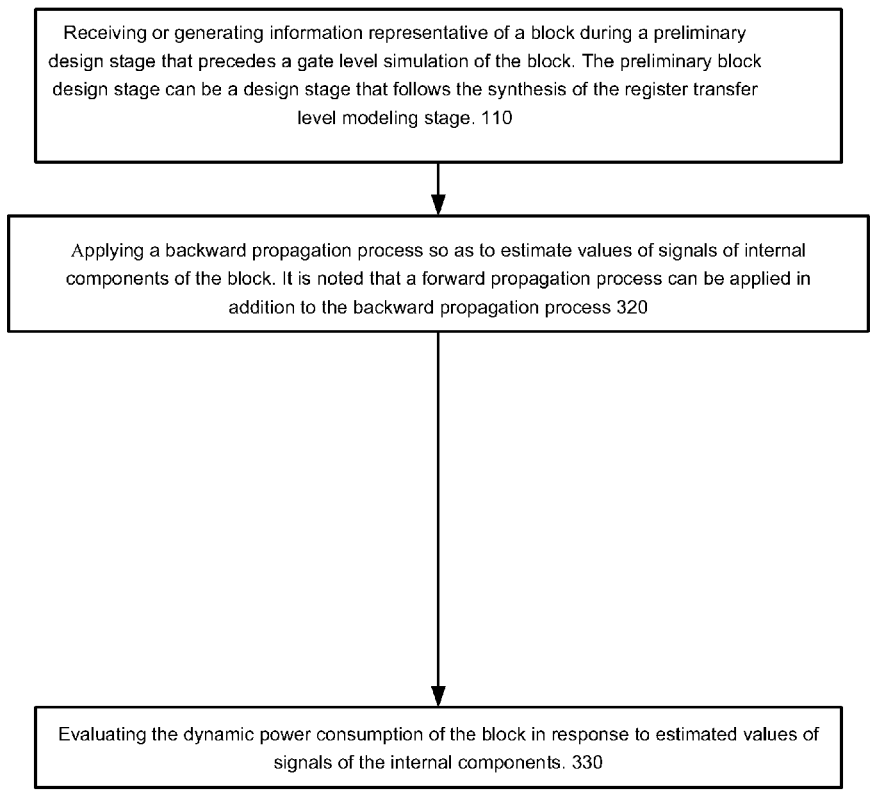
FIG. 3 schematically shows an example of embodiment of a method for estimating a dynamic power consumption of a block.

FIG. 3 illustrates method 300 for evaluating a dynamic power consumption of a block, according to an embodiment of the invention.

Method 300 differs from method 200 by being responsive to values of signals rather than their change probabilities.

It can be applied when change probabilities that are not known are characterized by a low accuracy level.

Method 300 starts by stage 310 of receiving or generating information representative of the block during a preliminary block design stage that precedes a gate level simulation of the block.

Stage 310 is followed by stage 320 of applying a backward propagation process to estimate values of signals of internal components of the block. It is noted that a forward propagation process can be applied in addition to the backward propagation process.

Stage 320 is followed by stage 330 of evaluating the dynamic power consumption of the block in response to estimated values of signals of the internal components.

Method 300 can further include estimating change probabilities of the internal components of the block. In this case, stage 330 of evaluating the dynamic power consumption of the block is further responsive to the change probabilities of the internal components of the block.

The mentioned above methods can provide highly accurate estimations. The accuracy of a dynamic power estimation is about 10 percent (in relation to power estimations executed by much more complicated estimations that are performed after gate level synthesis such as the Power Meter of Cadence) or even better (less than 10%).

Conveniently, a computer program product is provided. It can include a computer usable medium including a computer readable program, wherein the computer readable program when executed on a computer causes the computer to: receive or generate information representative of the block during a preliminary block design stage that precedes a gate level simulation of the block; estimate change probabilities of signals of internal components of the block; and evaluate the dynamic power consumption of the block in response to the change probabilities of signals of the internal components of the block.

The computer usable medium can be read by optic means, magnetic means, electrical means, or a combination thereof. It can be a memory circuit of an integrated circuit, a memory chip, a diskette, a disk, a type, a disk on key, can be downloadable over a network and the like.

Conveniently, the computer readable program when executed on a computer causes the computer to apply a backward propagation process during the estimation of the activities probabilities.

Conveniently, the computer readable program when executed on a computer causes the computer to apply a backward propagation process and a forward propagation process during the estimation of the activities probabilities and to resolve conflicts that result from the forward propagation process and the backward propagation process.

Conveniently, the computer readable program when executed on a computer causes the computer to assign an accuracy attribute to a change probability of a signal of an internal component of the block.

Conveniently, the preliminary design stage is a place and route design stage and wherein the computer readable program when executed on a computer causes the computer to estimate change probabilities of internal components of the block in response to simulated signals received by block input ports and to simulated signals outputted by clock output ports.

Conveniently, the computer readable program when executed on a computer causes the computer to estimate a power consumption of a block portion that receives a gated clock signal.

Conveniently, the computer readable program when executed on a computer causes the computer to estimate change probabilities of flip-flops of the block.

Conveniently, the computer readable program when executed on a computer causes the computer to estimate a change probability of a signal of an internal component of the block in response to an average of change probabilities of an input signal to the internal component and in response to a logic function applied by the internal component.

Conveniently, the computer readable program when executed on a computer causes the computer to apply a backward propagation process so as to estimate values of signals inputted to internal components of the block; and evaluate the dynamic power consumption of the block in response to estimated values of signals inputted to internal components.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. In addition, if the logically true state is a logic level zero, the logically false state is a logic level one.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

In addition, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. For example, However, other modifications, variations, and alternatives are also possible. The specifications and drawings are, accordingly, to be regarded in an illustrative rather than in a restrictive sense.

The word 'comprising' does not exclude the presence of other elements or steps then those listed in a claim. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

We claim:

1. A method for evaluating a dynamic power consumption of a block, the method comprising:
   receiving or generating, by a computer, information representative of the block during a preliminary block design stage that precedes a gate level simulation of the block;
   applying a backward propagation process;
   applying a forward propagation process;
   resolving conflicts that result from the forward propagation process and the backward propagation process;
   estimating change probabilities of signals of internal components of the block; and
   evaluating a dynamic power consumption of the block in response to the change probabilities of the signals of internal components of the block.

2. The method according to claim 1 comprising assigning an accuracy attribute to a change probability of a signal of an internal component of the block.

3. The method according to claim 1 wherein the preliminary design stage is a place and route design stage and wherein the estimation is responsive to simulated signals received by block input ports and to simulated signals outputted by output ports of the block.

4. The method according to claim 1 comprising estimating a power consumption of a block portion that receives a gated clock signal.

5. The method according to claim 1 comprising estimating change probability of flip-flops of the block.

6. The method according to claim 1 comprising estimating a change probability of a signal of an internal component of the block in response to a change probabilities of an input signal to the internal component and in response to a logic function applied by the internal component.

7. A method for evaluating a dynamic power consumption of a block, the method comprising:
receiving or generating, by a computer, information representative of the block during a preliminary block design stage that precedes a gate level simulation of the block;
applying a backward propagation process to estimate values of signals of internal components of the block;
applying a forward propagation process to estimate the values of signals of internal components of the block;
resolving conflicts that result from the forward propagation process and the backward propagation process; and
evaluating the dynamic power consumption of the block in response to estimated values of signals of the internal components.

8. The method according to claim 7 further comprising estimating change probabilities of the internal components of the block; wherein the evaluating of the dynamic power consumption of the block is further responsive to the change probabilities of the internal components of the block.

9. A computer program product comprising a non-transitory computer usable medium including a computer readable program, wherein the computer readable program when executed on a computer causes the computer to:
receive or generate information representative of the block during a preliminary block design stage that precedes a gate level simulation of the block;
estimate change probabilities of signals of internal components of the block;
apply a backward propagation process during the estimation of the change probabilities;
apply a forward propagation process during the estimation of the change probabilities;
resolve conflicts that result from the forward propagation process and the backward propagation process; and
evaluate the dynamic power consumption of the block in response to the change probabilities of signals of the internal components of the block.

10. The computer program product according to claim 9, wherein the computer readable program when executed on the computer causes the computer to further apply the backward propagation process during an estimation of an activities probabilities.

11. The computer program product according to claim 9, wherein the computer readable program when executed on the computer causes the computer to assign an accuracy attribute to an change probability of a signal of an internal component of the block.

12. The computer program product according to claim 9, wherein the preliminary design stage is a place and route design stage and wherein the computer readable program when executed on the computer causes the computer to estimate change probabilities of internal components of the block in response to simulated signals received by block input ports and to simulated signals outputted by clock output ports.

13. The computer program product according to claim 9, wherein the computer readable program when executed on the computer causes the computer to estimate a power consumption of a block portion that receives a gated clock signal.

14. The computer program product according to claim 9, wherein the computer readable program when executed on the computer causes the computer to estimate change probabilities of flip-flops of the block.

15. The computer program product according to claim 9, wherein the computer readable program when executed on the computer causes the computer to estimate an change probability of a signal of an internal component of the block in response to an average of change probabilities of an input signal to the internal component and in response to a logic function applied by the internal component.

16. The computer program product according to claim 9, wherein the computer readable program when executed on the computer causes the computer to apply the backward propagation process so as to estimate values of signals inputted to the internal components of the block; and evaluate the dynamic power consumption of the block in response to estimated values of signals inputted to the internal components.

* * * * *